(12) United States Patent
Nakano et al.

(10) Patent No.: US 9,284,642 B2
(45) Date of Patent: Mar. 15, 2016

(54) METHOD FOR FORMING OXIDE FILM BY PLASMA-ASSISTED PROCESSING

(71) Applicant: ASM IP Holding B.V., Almere (NL)

(72) Inventors: Ryu Nakano, Sagamihara (JP); Naoki Inoue, Hachioji (JP)

(73) Assignee: ASM IP Holding B.V., Almere (NL)

( * ) Notice: Subject to any disclaimer, the term of this patent is extended or adjusted under 35 U.S.C. 154(b) by 127 days.

(21) Appl. No.: 14/031,982

(22) Filed: Sep. 19, 2013

(65) Prior Publication Data

US 2015/0079311 A1    Mar. 19, 2015

(51) Int. Cl.
*C23C 16/40* (2006.01)
*C23C 16/455* (2006.01)
*C23C 16/509* (2006.01)
*H01L 21/02* (2006.01)

(52) U.S. Cl.
CPC ............. *C23C 16/401* (2013.01); *C23C 16/405* (2013.01); *C23C 16/4554* (2013.01); *C23C 16/5096* (2013.01); *H01L 21/0228* (2013.01); *H01L 21/02112* (2013.01); *H01L 21/02164* (2013.01); *H01L 21/02186* (2013.01); *H01L 21/02211* (2013.01); *H01L 21/02219* (2013.01); *H01L 21/02274* (2013.01)

(58) Field of Classification Search
CPC ..... C23C 16/40; C23C 16/45536; H05H 1/24
See application file for complete search history.

(56) References Cited

U.S. PATENT DOCUMENTS

| | | | |
|---|---|---|---|
| 8,647,722 B2 * | 2/2014 | Kobayashi et al. ... | C23C 16/345 427/569 |
| 2002/0197849 A1 * | 12/2002 | Mandal ......................... | 438/633 |
| 2005/0208718 A1 * | 9/2005 | Lim et al. ...................... | 438/240 |
| 2007/0275166 A1 * | 11/2007 | Thridandam et al. ....... | 427/248.1 |
| 2008/0023436 A1 * | 1/2008 | Gros-Jean et al. ................ | 216/6 |
| 2010/0255218 A1 * | 10/2010 | Oka et al. ....................... | 427/579 |
| 2011/0183079 A1 * | 7/2011 | Jackson et al. ................ | 427/488 |
| 2011/0262642 A1 * | 10/2011 | Xiao et al. ............. | 427/255.394 |
| 2012/0128897 A1 * | 5/2012 | Xiao et al. .............. | C07F 7/025 427/579 |
| 2012/0171874 A1 * | 7/2012 | Thridandam et al. .......... | 438/786 |
| 2013/0078392 A1 * | 3/2013 | Xiao et al. ..................... | 427/579 |
| 2013/0319290 A1 * | 12/2013 | Xiao et al. ................ | 106/287.11 |
| 2013/0323435 A1 * | 12/2013 | Xiao et al. ..................... | 427/579 |
| 2015/0004317 A1 * | 1/2015 | Dussarrat et al. .......... | 427/255.6 |

OTHER PUBLICATIONS

Yun, Yongsup, et al., "Behavior of Various Organosilicon Molecules in PECVD Processes for Hydrocarbon-doped Silicon Oxide Films". Solid State Phenomena vols. 124-126 (2007) pp. 347-350.*
Heo, K., et al., "Structural Characterization of Nanoporous Low-Dielectric Constant SiCOH Films Using Organosilane Precursors". NSTI-Nanotech 2007, vol. 4, 2007, pp. 122-123.*
Choi, Jong-Sik, et al., "Low Temperature Formation of Silicon Oxide Thin Films by Atomic Layer Deposition Using NH3/O2 Plasma". ECS Solid State Letters, 2 (12) P114-P116 (2013).*
Article published in J. Vac. Sci. Technol. A 29(4), 041501 entitled "Plasma Enhanced Atomic Layer Deposition of SiNx: H and SiO2," by Sean W. King, published 2011, 9 pages.

* cited by examiner

*Primary Examiner* — Bret Chen
(74) *Attorney, Agent, or Firm* — Snell & Wilmer LLP

(57) ABSTRACT

A method for forming an oxide film by plasma-assisted processing includes: (i) supplying a precursor reactive to none of oxygen, $C_xO_y$, and $N_xO_y$ (x and y are integers) without a plasma to a reaction space wherein a substrate is placed; (ii) exposing the precursor to a plasma of $C_xO_y$ and/or $N_xO_y$ in the reaction space; and (iii) forming an oxide film on the substrate using the precursor and the plasma.

7 Claims, 3 Drawing Sheets

US 9,284,642 B2

METHOD FOR FORMING OXIDE FILM BY PLASMA-ASSISTED PROCESSING

BACKGROUND OF THE INVENTION

1. Field of the Invention

The present invention generally relates to a method for forming an oxide film of a metal or silicon by plasma-assisted processing such as plasma-enhanced atomic layer deposition (PEALD).

2. Description of the Related Art

In a PEALD process, depending on the type of application, there are problems to be solved, such as oxidation of an underlying layer and auto-doping in a process of boron-silicate glass (BSG)/phosphor-silicate glass (PSG). Conventionally, these problems have been handled by lowering RF power.

For example, low RF power is required in the BSG/PSG process for solid state diffusion (SSD) because, as illustrated in FIG. 1a when high RF power is applied, penetration of dopant (boron) 2 into a Si substrate 3 occurs during deposition of a BSG film 1 due to the ion bombardment effect. That is, although a portion of BSG/PSG film is removed from an area where diffusion of dopant is not desired during and after a deposition step, and then heat treatment of the substrate is conducted so that the diffusion of impurities can be confined only to a certain area in the substrate, the unwanted diffusion of impurities will result in another area of the substrate if the diffusion occurs during deposition when high RF power is applied.

Further, low RF power is required in a SiO process where oxidation of an underlying layer 7 is undesired because, as illustrated in FIG. 1b when high RF power is applied, the underlying layer 7 is oxidized due to the effects of oxygen plasma, ion bombardment, and sputtering during film deposition. That is, when a SiO film 5 is deposited by PEALD on the underlying layer 7 in which W, TiN, or other materials are contained or which is a SiN film, the material constituting the underlying layer 7 is oxidized in an upper portion 6 thereof by a plasma including oxidizing gas used for deposition of the SiO film 5, and thereby desired device characteristics cannot be obtained.

In addition, low RF power is required in a process of film deposition on a photoresist because, as illustrated in FIG. 1c when high RF power is applied during the film deposition process, the photoresist dimensions are set back and reduced due to the effects of oxygen plasma, ion bombardment, and sputtering. That is, when an oxide 9 is deposited by PEALD on a patterned photoresist 10 formed on a substrate 11 in a double patterning process, a portion 12 of the underlying photoresist 10 is oxidized and eroded by a plasma including oxidizing gas used for deposition of the SiO film 9, and the desired dimensions of the photoresist 10 cannot be obtained.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In some embodiments, despite the fact that a precursor to be used is non-reactive to oxygen without a plasma, oxygen is not used as an oxygen-supplying gas for depositing an oxide film on a substrate, and instead, carbon dioxide is used as an oxygen-supplying gas. In some embodiments, $C_xO_y$ and/or NA (x and y are integers) are/is used as an oxygen-supplying gas. In some embodiments, a mixture of oxygen, $C_xO_y$, and $N_xO_y$ in any combination can be used. As the precursor, a chemical such as $SiH_4$ is not used, which is reactive to any of oxygen, $C_xO_y$, and $N_xO_y$ without a plasma. Preferably, organoaminosilane can be used as a precursor.

Accordingly, as compared with use of oxygen, when $C_xO_y$ and/or $N_xO_y$ are/is used in place of oxygen under equivalent deposition conditions, oxidation of an underlying layer can effectively be inhibited. In PEALD where $C_xO_y$ and/or $N_xO_y$ are/is used in place of oxygen, even when a duration of purging after feeding a precursor is substantially short or insufficient for removing non-adsorbed precursor from the surface of a substrate, the generation of particles can effectively be inhibited. The process where a duration of purging after feeding a precursor is substantially short or insufficient for removing non-adsorbed precursor from the surface of a substrate is referred to as pseudo-ALD (or surface-reaction controlled CVD). Further, the use of $C_xO_y$ and/or $N_xO_y$ does not substantially affect ignition of plasma as compared with use of oxygen, wherein even when oxygen is not used, ignition of plasma can be stabilized without increasing RF power to be applied. Additionally, an oxide film obtained according to some embodiments has high affinity with a nitride film such as SiN obtained using monosilane. If not only an oxide film but also nitride film are formed using a carbon dioxide plasma, clogging of the lines and generation of particles by reaction between oxygen and monosilane can be avoided, and because dust free deposition or substantially dust free deposition of oxide film (e.g., the number of particles is about 10 or less on a substrate) can be performed, and when forming a film capacitor having a layer structure of oxide/nitride/oxide, a duration of purging or vacuuming in PEALD can be shortened, thereby increasing throughput.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1A:
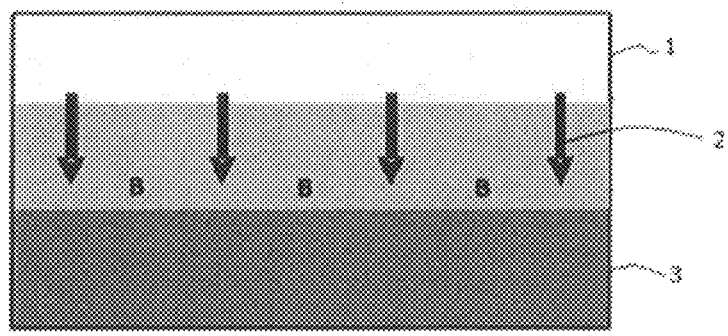
FIG. 1a is a schematic cross section of a partially fabricated integrated circuit, showing a process for boro-silicate glass (BSG)/phosphor-silicate glass (PSG).

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead may be comprised of, consist essentially of, or consist of a metal- or silicon-containing precursor and a reactant gas. The reactant gas includes a gas for oxidizing the precursor when RF power is applied to the reactant gas. The precursor and the reactant gas can be introduced separately to a reaction space. The precursor can be introduced with a carrier gas such as a rare gas. A gas other than the process gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute an workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

In some embodiments, a method for forming an oxide film by plasma-assisted processing, comprises: (i) supplying a precursor reactive to none of oxygen, $C_xO_y$, and $N_xO_y$ (x and y are integers) without a plasma to a reaction space wherein a substrate is placed; (ii) exposing the precursor to a plasma of $C_xO_y$ and/or $N_xO_y$ in the reaction space; and (iii) forming an oxide film on the substrate using the precursor and the plasma. In this disclosure, the "oxide film" may refer to a film characterized by M-O bonds (M is a metal or silicon), constituted mainly or predominantly by M-O bonds, categorized in Mi-O films, and/or having a main skeleton substantially constituted by Mi-O bonds. When a precursor having hydrocarbons such as organoaminosilane is used, the oxide film may contain carbons derived from the precursor. In some embodiments, the oxide film may contain C, H, and/or N as a minor element.

As the precursor, silane compounds such as monosilane are excluded since they are reactive to oxygen even without a plasma. In some embodiments, the precursor is non-reactive to oxygen, $C_xO_y$, and $N_xO_y$, and the term "non-reactive" refers to detecting no film volume or particles generated on a substrate as a result of reaction under conditions where the precursor and oxygen, $C_xO_y$, or $N_xO_y$ are introduced simultaneously to a reaction space in an atmosphere having a temperature of 400° C. or less and a pressure of 10 torr or less in the absence of plasma. In some embodiments, the precursor contains Si, Ti, or Ge, and the oxide film is constituted substantially by SiO, TiO, or GeO. In other embodiments, the precursor contains As, Ga, Sb, In, Al, or Zr. A skilled artisan can select a suitable precursor depending on the type of oxide film through routine experiment based on this disclosure.

For example, for SiO film, organoaminosilanes can be used, including bis(diethylamino)silane (BDEAS or SAM24), tetrakis(dimethylamino)silane (4DMAS), tris(dimethylamino)silane (3DMAS), bis(dimethylamino)silane (2DMAS), tetrakis(ethylmethylamino)silane (4EMAS), tris (ethylmethylamino)silane (3EMAS), bis(tertiary-butylamino)silane (BTBAS), and bis(ethylmethylamino)silane (BEMAS), singly or in any combination of two or more. For example, for AsO film, triethoxyarsine and triethylarsenate, singly or in any combination, can be used. For example, for SbO film, $Sb(i-O-C_3H_7)_3$ and antimony tri-ethoxide, singly or in any combination, can be used. For example, for InO film, $(CH_3)_3In$ and $(C_2H_5)_3In$, singly or in any combination, can be used. For example, for GaO film, $Ga(OCH_3)_3$, and $Ga(OC_2H_5)_3$, singly or in any combination of two or more, can be used. For example, for TiO film, titanium isopropoxide or titanium tetraisopropoxide (TTiP), tetrakis(dimethylamino) titanium (TDMAT), tetrakis(1-methoxy-2-methyl-2-propanolate)titanium (Ti(MMP)4), titanium-tetra-butoxide (TTB), and tetrakis(ethylmethylamino)titanium (TEMAT), singly or in any combination of two or more, can be used. For example, for GeO film, tetraethyloxygermane (TEOG), tetramethyloxygermane (TMOG), tetraethylgermane (TEG), tetramethylgermane (TMG), tetrakis(dimethylamino)germanium (TDMAGe), germanium tetraisopropoxide, and germanium tetraisobutoxide, singly or in any combination of two or more, can be used. In some embodiments, the precursor consists essentially of any of the foregoing compounds. The term "consisting essentially of" is used to the full extent permitted by law and regulation.

In some embodiments, the plasma is generated using $C_xO_y$ and/or $N_xO_y$ with or without a rare gas. As $C_xO_y$, CO, $C_2O$, $CO_2$, $C_3O_2$, $CO_3$, and $C_5O_2$ can be used singly or in any combination of two or more. As $N_xO_y$, NO, $N_2O$, $NO_2$, $N_2O_3$, $N_2O_4$, and $N_2O_5$ can be used singly or in any combination of two or more. In some embodiments, the plasma of $C_xO_y$ and/or $N_xO_y$ is a $CO_2$ plasma. In some embodiments, in step (ii), an oxygen plasma is further added to the reaction space except for the beginning of step (ii), where a plasma of $C_xO_y$ and/or $N_xO_y$ does not provide sufficient oxidizability so that an oxide film with desired properties is not obtained, or where a plasma of $C_xO_y$ and/or $N_xO_y$ increases concentration of impurities in an oxide film. In the beginning of step (ii), a plasma of $C_xO_y$ and/or $N_xO_y$ is used without an oxygen plasma so as to inhibit oxidation of an underlying layer, and after an oxide film is formed on an interface surface of the underlying layer and becomes thick enough (e.g., a thickness of about 0.5 nm to about 2.0 nm, depending on the RF power) for alleviating the oxidation problem (where the oxide film itself functions as a barrier layer blocking oxidation of the underlying layer), an oxygen plasma is added to or partially or completely replaces the plasma of $C_xO_y$ and/or $N_xO_y$. In some embodiments, the oxide film is composed of a lower oxide layer formed using a plasma of $C_xO_y$ and/or $N_xO_y$ without a plasma of oxygen, and an upper oxide layer formed using a mixed plasma of oxygen and $C_xO_y$ and/or $N_xO_y$ (wherein a flow ratio of oxygen to $C_xO_y$ and/or NA may be in a range of more than 0/100 to about 100/0). In some embodiments, in step (ii), no oxygen plasma is used in the reaction space throughout step (ii).

Figure 1B:
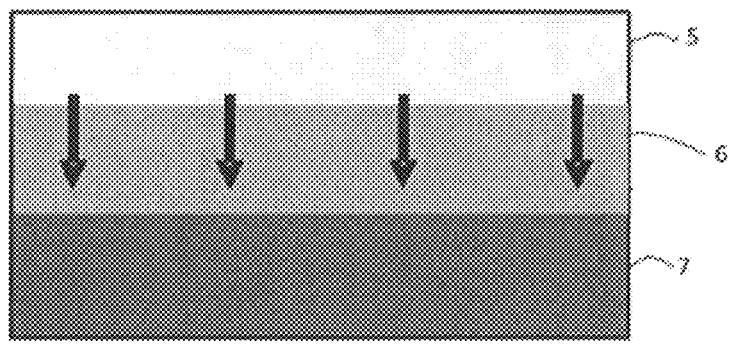
FIG. 1b is a schematic cross section of a partially fabricated integrated circuit, showing a SiO process.
Figure 1C:
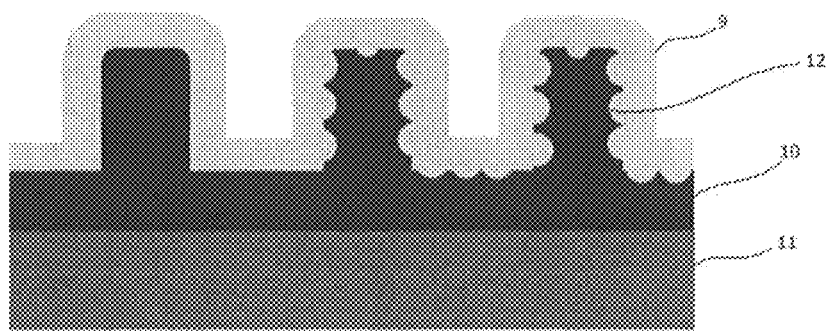
FIG. 1c is a schematic cross section of a partially fabricated integrated circuit, showing a process of depositing a film on a photoresist.

In some embodiments, the plasma-assisted processing is plasma-enhanced atomic layer deposition (PEALD), wherein step (i) comprises (ia) supplying the precursor in the reaction space to adsorb the precursor on the substrate, followed by purging to remove a non-adsorbed precursor from the substrate, step (ii) comprises (iia) exposing the adsorbed precursor to the plasma to cause surface reaction to the adsorbed precursor, followed by purging to remove a non-reacted component from the substrate, and steps (ia) and (iia) constitute one cycle and are repeated to form the oxide film in step (iii). For example, the above method can effectively solve the problems in the processes described in FIGS. 1a to 1c where oxygen is conventionally used as an oxidizing gas, and thus, in some embodiments, the above method is applied to modify the processes described in FIGS. 1a to 1 c. A skilled artisan can perform such modified processes through routine experimentation based on this disclosure.

In some embodiments, an oxide film can be formed by PEALD under conditions shown in Table 1 below, although the conditions may vary depending on the type of oxide film. Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle.

TABLE 1

(the numbers are approximate)

|  | Preferably | Typically (±50%) |
|---|---|---|
| Precursor partial pressure of Carrier gas | 3% to 30% | 10% |
| Carrier gas flow (continuous) | Ar; 1000 sccm to 3000 sccm | Ar; 2000 sccm |
| Reactant gas flow (continuous) | $CO_2$; 200 sccm to 5000 sccm | $CO_2$; 2000 sccm |
| Auxiliary gas flow (continuous) | Ar; 200 sccm to 5000 sccm | Ar; 2000 sccm |

TABLE 1-continued (the numbers are approximate)

|  |  | Preferably | Typically (±50%) |
|---|---|---|---|
| Substrate temperature |  | 25° C. to 500° C. | 300° C. |
| Pressure |  | 133 Pa to 800 Pa | 400 Pa |
| RF power (13.56 MHz) |  | 10 W to 1000 W (300-mm tool) | 200 W |
| Step (ia) | Precursor supply time | 0.05 sec. to 4 sec. | 0.2 sec. |
| | Purge time after precursor pulse | 0.2 sec. to 3 sec. | 0.3 sec. |
| Step (iia) | RF plasma exciting time | 0.05 sec. to 5 sec. | 0.2 sec. |
| | Purge time after RF application | 0.05 sec. to 1 sec. | 0.1 sec. |
| Number of cycles |  | 10-200 | 50 |

In the above, by continuously feeding the carrier gas and the auxiliary gas, no separate purge gas is required, since the continuous feed of these gases functions as a mechanism of purging. The reactant gas can be continuously fed since it is not reactive to the precursor, and thus, the continuous feed of the reactant gas also functions as a mechanism of purging.

In some embodiments, the thickness of the oxide film by PEALD is in a range of about 1 nm to about 350 nm (a desired film thickness can be selected as deemed appropriate according to the application and purpose of film, etc.).

As a carrier gas, seal gas, purge gas, or process-adjustment gas (auxiliary gas), a rare gas such as Ar, He, Ne, Kr, and Xe can be used, singly or in any combination of two or more. In some embodiments, the purging in step (ia) is insufficient for removing most of the non-adsorbed precursor, wherein the purge time may be in a range of about 0.2 sec. to about 3 sec., typically about 0.3 sec. to about 1.0 Sec. When the purge time is shortened in ALD, a CVD-like process occurs on and near a surface of the substrate, and thus, this process is referred to as pseudo-ALD or CVD-associated ALD. Pseudo-ALD shortens the process time, increasing productivity, and widens control parameter margins, although the conformality of a film may not be as good as that by pure ALD. This process can be applied to formation of a pre-coat on an inner wall of a reaction chamber. The pre-coat (with a thickness of e.g., about 20 nm to about 200 nm) is effective in stabilizing a plasma reaction when pseudo-ALD is performed. Further, surprisingly, in pseudo-ALD in some embodiments, despite the fact that the purge time is significantly shortened and thus reaction of non-adsorbed precursor occurs by a plasma in a gas phase, the number of particles on a substrate does not increase.

In some embodiments, the plasma is generated in the reaction space by applying RF power to the reaction space (in-situ plasma). In some embodiments, $C_xO_y$ and/or $N_xO_y$ are/is supplied continuously to the reaction space throughout steps (i) to (iii), and the reaction gas is excited when RF power is applied. In this disclosure, "continuously" refers to without breaking a vacuum, without interruption as a timeline, without changing treatment conditions, immediately thereafter, as a next step, or without a discrete physical or chemical boundary between two structures in some embodiments.

Alternatively, $C_xO_y$ and/or $N_xO_y$ can be supplied in pulses which do not overlap pulses of the precursor. In some embodiments, a remote plasma unit can be used for exciting the reactant gas and supplying a plasma to the reaction space.

In some embodiments, the plasma-assisted processing is plasma-enhanced chemical vapor deposition (PECVD), wherein step (i) comprises (ib) supplying the precursor in the reaction space, and step (ii) comprises (iib) exposing the precursor to the plasma to cause reaction in the reaction space before a reacted component of the precursor deposits on the substrate. In the above, when using $C_xO_y$ and/or $N_xO_y$ as a reactant gas in place of oxygen in PECVD, surprisingly, the number of particles on a substrate can significantly be lowered, and thus, a mixed process of PEALD and PECVD can effectively and continuously be performed without increasing the number of particles, allowing expansion of use of PECVD.

In some embodiments, an oxide film can be formed by PECVD under conditions shown in Table 2 below, although the conditions may vary depending on the type of oxide film.

TABLE 2

(the numbers are approximate)

|  | Preferably | Typically (±50%) |
|---|---|---|
| Precursor partial pressure of Carrier gas | 3% to 30% | 10% |
| Carrier gas flow (continuous) | Ar; 1000 sccm to 3000 sccm | Ar; 2000 sccm |
| Reactant gas flow (continuous) | $CO_2$; 200 sccm to 5000 sccm | $CO_2$; 2000 sccm |
| Substrate temperature | 25° C. to 500° C. | 300° C. |
| Pressure | 133 Pa to 800 Pa | 400 Pa |
| RF power (13.56 MHz) | 10 W to 1000 W (300-mm tool) | 200 W |
| Duration of process | 1 sec. to 600 sec. | 120 sec. |

In some embodiments, the thickness of the oxide film by PECVD is in a range of about 5 nm to about 1000 nm (a desired film thickness can be selected as deemed appropriate according to the application and purpose of film, etc.). As a carrier gas, seal gas, purge gas, or process-adjustment gas, a rare gas such as Ar, He, Ne, Kr, and Xe can be used, singly or in any combination of two or more.

In some embodiments, the plasma is generated in the reaction space by applying RF power to the reaction space (in-situ plasma). In some embodiments, a remote plasma unit can be used for exciting the reactant gas and supplying a plasma to the reaction space.

Figure 4:
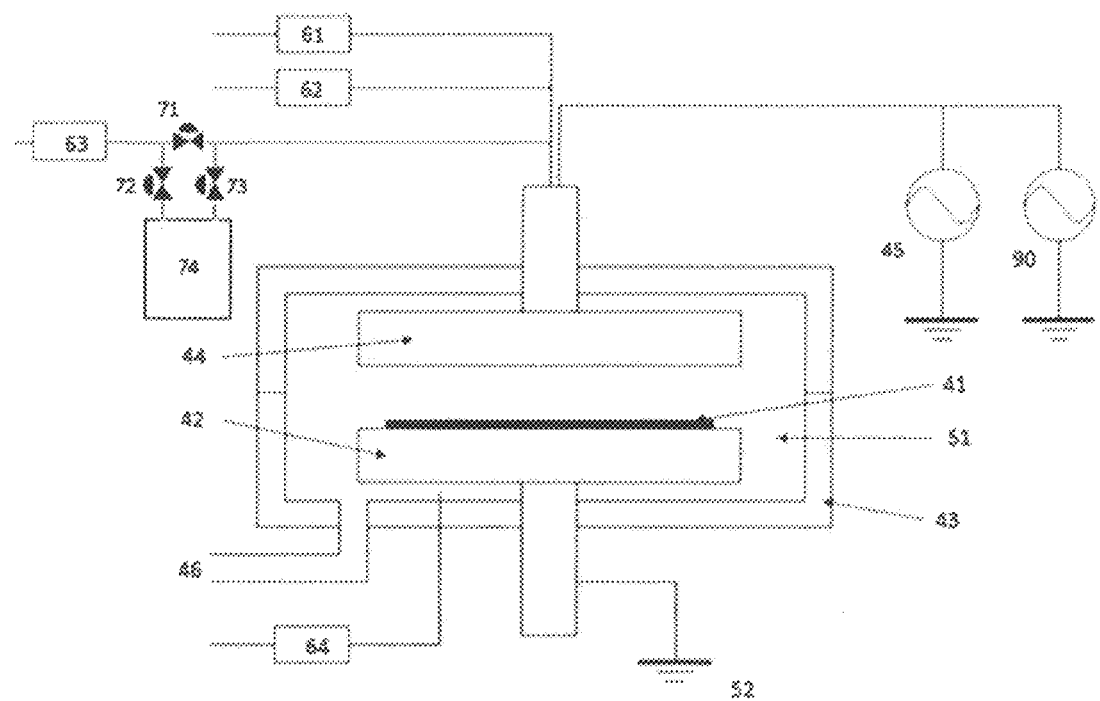
FIG. 4 is a schematic representation of a PEALD apparatus for depositing an oxide film, usable in an embodiment of the present invention.

FIG. 4 is a schematic view of a PEALD apparatus, desirably in conjunction with controls programmed to conduct the sequences described below, usable in some embodiments of the present invention. In this figure, by providing a pair of electrically conductive flat-plate electrodes 44, 42 in parallel and facing each other in the interior 51 of a reaction chamber 43, applying HRF power (13.56 MHz or 27 MHz) 5 (and LRF power of 5 MHz or less (400 kHz-500 kHz) as necessary) 90 to one side, and electrically grounding 52 the other side, a plasma is excited between the electrodes. A temperature regulator is provided in a lower stage 42 (the lower electrode), and a temperature of a substrate 41 placed thereon is kept constant at a given temperature. The upper electrode 44 serves as a shower plate as well, and reaction gas and rare gas are introduced into the reaction chamber 43 through a gas flow controller 63, pulse flow control valves 71-73, and the shower plate. In this embodiment, the precursor is stored as a liquid in a bottle 74 equipped with a heater. The rare gas can continuously flow into the reaction chamber 43 either (a) through the valve 71 when the valves 72 and 73 are closed, or (b) through the valve 72, the bottle 74, and the valve 73 when the valve 71 is closed. In (b), the rare gas carries the precursor and flows into the reaction chamber 43 together with the precursor. In (a), the rare gas alone flows into the reaction chamber 43. By the above mechanism with operation of the valves, the rare gas can be fed continuously while pulsing the feed of the precursor. Additionally, in the reaction chamber 43, an exhaust pipe 46 is provided, through which gas in the interior 51 of the reaction chamber 43 is exhausted. Additionally, the reaction chamber is provided with a seal gas flow controller 64 to introduce seal gas into the interior 51 of the reaction chamber 43 (a separation plate for separating a reaction zone and a transfer zone in the interior of the reaction chamber is omitted from this figure). For PECVD, the same apparatus can be used without using the pulsing mechanisms.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

EXAMPLES

Reference Examples 1 and 2

In order to evaluate the degree of oxidation caused by an oxygen plasma (Reference Example 1) and a carbon dioxide plasma (Reference Example 2), naked Si substrates were exposed to an oxygen plasma and a carbon dioxide plasma, respectively, without supplying a precursor (without depositing an oxide film) thereon so that the degree of oxidation by each plasma could be evaluated in an accelerated manner based on a thickness of SiO generated by oxidizing the surface of the naked Si substrate by the plasma. It is considered that in depositing an oxide film, at least in the beginning of the deposition process, phenomena similar to those observed in Reference Examples 1 and 2 occur.

A naked Si substrate was loaded in an apparatus illustrated in FIG. 4 and exposed to a plasma under conditions shown in Table 3 below.

TABLE 3

| Reactant gas flow (continuous) | $O_2$ or $CO_2$; 1200 sccm |
|---|---|
| Auxiliary gas flow (continuous) | Ar; 2400 sccm |
|  | He; 100 sccm |
| Process temperature | 300° C. |
| Pressure | 250 Pa |
| RF power (13.56 MHz) | 50 W |
| Duration | 5 sec. to 100 sec. |

Figure 2:
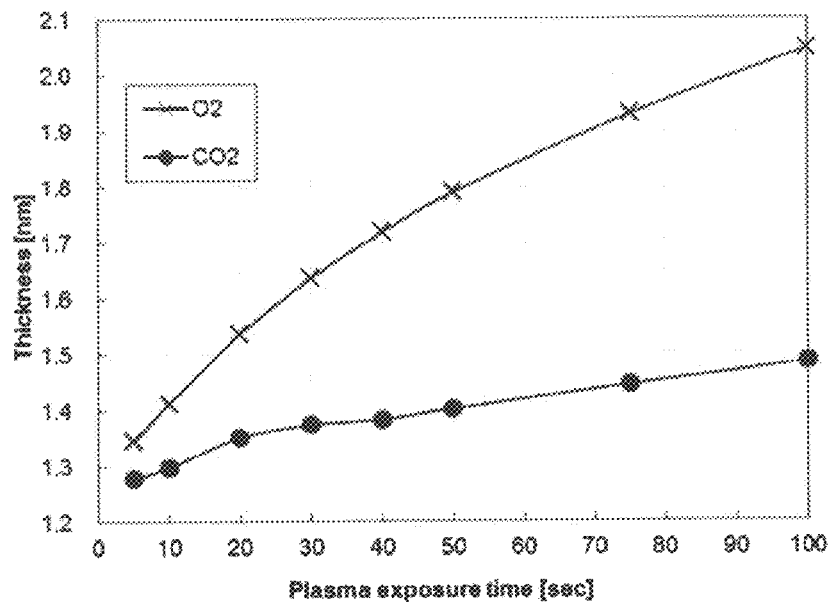
FIG. 2 is a graph showing the relationship between the degree of oxidation (expressed as thickness [nm] of generated SiO layer in a Si substrate) and plasma exposure time [sec] using an oxygen plasma ($O_2$) according to a comparative example and a carbon dioxide plasma ($CO_2$) according to an embodiment of the present invention.

The compositions of the Si substrate exposed to the plasma were analyzed in the depth direction, and a depth (nm) of a portion where oxygen was detected was measured as a thickness of SiO layer. The results are shown in FIG. 2. As demonstrated in FIG. 2, when $CO_2$ was used, a thickness of SiO layer was thinner than that of SiO layer when $O_2$ was used, by about 8% ((1.41−1.3)/1.41) at an exposure time of 10 seconds and by about 27% ((2.05−1.49)/2.05) at an exposure time of 100 seconds. By using $CO_2$ as an oxidizing gas, as compared with the use of $O_2$, the degree of oxidation of an underlying layer can significantly be reduced.

Examples 1 and 2 and Comparative Examples 1 and 2

Oxide films were deposited on substrates by PEALD under conditions shown in Table 4 below using the apparatus illustrated in FIG. 4. In Comparative Examples 1 and 2, $O_2$ was used as the oxidizing gas, whereas in Examples 1 and 2, $CO_2$ was used as the oxidizing gas, and in Comparative Example 1 and Example 1, the precursor purge time was 0.8 seconds, whereas in Comparative Example 2 and Example 2, the precursor purge time was 0.1 seconds.

TABLE 4

| | Com. Ex. 1 | Com. Ex. 2 | Ex. 1 | Ex. 2 |
|---|---|---|---|---|
| Deposition cycle [times] | | 200 | | |
| Precursor | | Bisdiethylaminosilane | | |
| Precursor bottle temp. [° C.] | | Room temperature | | |
| Carrier gas flow (continuous) [sccm] | | Ar; 2,000 | | |
| Reactant gas flow (continuous) [sccm] | | $O_2$; 500 | | $CO_2$; 500 |
| Auxiliary gas flow (continuous) [slpm] | | Ar; 0.40 | | |
| Seal gas flow (continuous) [sccm] | | He; 100 | | |
| Chamber pressure [Pa] | | 200 | | |
| HRF [W] | | 100 | | |
| Susceptor temp. [° C.] | | 75 | | |
| Shower head temp. [° C.] | | 75 | | |
| Wall temp. [° C.] | | 75 | | |
| Electrode gap [mm] | | 13.0 | | |
| Time [sec.] Precursor feed | | 0.3 | | |
| Precursor purge | 0.8 | 0.1 | 0.8 | 0.1 |
| RF-ON | | 0.4 | | |
| Post purge | | 0.1 | | |
| Cycle time | 1.6 | 0.9 | 1.6 | 0.9 |
| Average film thickness [nm] | 25.4 | 69.0 | 10.3 | 25.1 |
| Growth rate [nm/cycle] | 0.127 | 0.3 | 0.052 | 0.1 |
| Film thickness uniformity [1sigma %] | 0.13 | 18.8 | 2.13 | 5.6 |
| Number of particles detected (>0.10 μm) | 4 | 42,495 | 0 | 9 |

Each substrate was analyzed in terms of the average film thickness, growth rate, film thickness uniformity, and number of particles detected. The results are shown in Table 4. In Comparative Example 1 and Example 1, the precursor purge time was 0.8 seconds which are considered to be sufficient for removing the non-adsorbed precursor from the surface of the substrate, whereas in Comparative Example 2 and Example 2, the precursor purge time was 0.1 seconds which is considered to be insufficient for removing the non-adsorbed precursor from the surface of the substrate. In Comparative Example 2, since a plasma was generated in the oxygen atmosphere without fully removing the non-adsorbed precursor, the non-adsorbed non-removed precursor reacted with the oxygen plasma in a gas phase, thereby depositing tens of thousands of particles, whereas in Example 2, when a plasma was generated in the carbon dioxide atmosphere, the number of particles was surprisingly less than 10. It is confirmed that by using a carbon dioxide plasma in PEALD, dust free deposition can be performed.

Example 3 and Comparative Example 3

Oxide films were deposited on substrates by PECVD (a precursor was exposed to a plasma) under conditions shown in Table 5 below using the apparatus illustrated in FIG. 4. In Comparative Example 3, $O_2$ was used as the oxidizing gas, whereas in Example 3, $CO_2$ was used as the oxidizing gas.

TABLE 5

| | Com. Ex. 3 | Ex. 3 |
|---|---|---|
| Deposition time [sec.] | 100 | |
| Precursor | Bisdiethylaminosilane | |
| Precursor bottle temp. [° C.] | Room temperature | |
| Carrier gas flow (continuous) [sccm] | Ar; 2,000 | |
| Reactant gas flow (continuous) [sccm] | $O_2$; 500 | $CO_2$; 500 |
| Auxiliary gas flow (continuous) [slpm] | Ar; 0.40 | |
| Seal gas flow (continuous) [sccm] | He; 100 | |
| Chamber pressure [Pa] | 200 | |
| HRF [W] | 53 | |
| Susceptor temp. [° C.] | 75 | |
| Shower head temp. [° C.] | 75 | |
| Wall temp. [° C.] | 75 | |
| Electrode gap [mm] | 13.0 | |
| Average film thickness [nm] | 102.86 | 40.0 |
| Film thickness uniformity [1sigma %] | 20.00 | 5.47 |
| Number of particles detected (>0.10 μm) | 47,646 | 7 |

Each substrate was analyzed in terms of the average film thickness, film thickness uniformity, and number of particles detected. The results are shown in Table 5. In Comparative Example 3, since a plasma was generated in the oxygen atmosphere, the precursor reacted with the oxygen plasma in a gas phase, thereby depositing tens of thousands of particles, whereas in Example 3, as in Example 2, when a plasma was generated in the carbon dioxide atmosphere, the number of particles was surprisingly less than 10. It is confirmed that by using a carbon dioxide plasma also in PECVD, dust free deposition can be performed.

Example 4

An oxide film was deposited on a substrate by PEALD under the conditions which were the same as in Example 2, except that the bottle was heated to 50° C. (thereby increasing the feed of the precursor). As a result, the growth rate was increased to 0.132 nm/cycle. However, the number of particles detected was less than 10, indicating that even when the feed was increased while maintaining the short purge time (0.1 seconds), the number of particles detected can remain extremely low.

Reference Example 3 and 4

Figure 3:
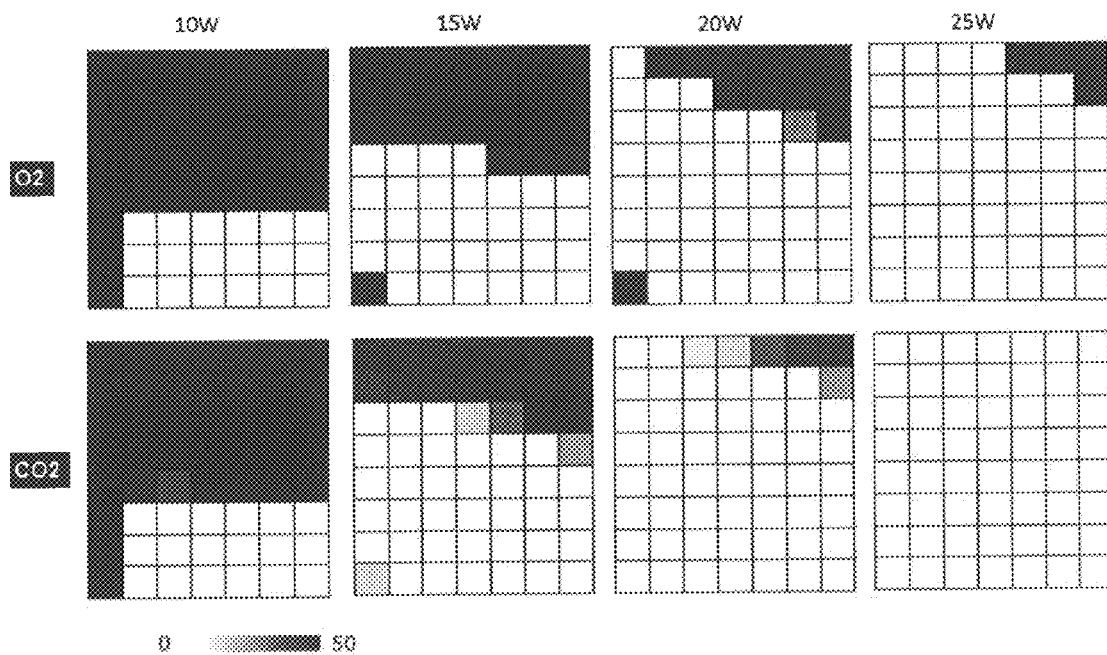
FIG. 3 shows plasma ignition charts at applied RF powers of 10 W, 15 W, 20 W, and 25 W when using an oxygen plasma ($O_2$) and a carbon dioxide plasma (CO2), wherein each chart is formed by a matrix defined by the vertical axis which is pressure [Pa] (the rows correspond to 222, 250, 300, 400, 500, 600, 700, and 800 Pa, respectively) and the horizontal axis which is a gap [mm] between the electrodes (the columns correspond to 9.5, 11, 12, 13, 14, 15, and 16 mm, respectively), and each cell shows the number of ignition failures per 50 attempts times using a gray scale from the lightest representing no ignition failure to the darkest representing 50 occurrences of ignition failure.

In order to evaluate a plasma ignition range using oxygen (Reference Example 3) and carbon dioxide (Reference Example 4), the ignition state was checked using the apparatus illustrated in FIG. 4 based on multiple matrixes each defined by a vertical axis which is pressure [Pa] (the rows correspond to 222, 250, 300, 400, 500, 600, 700, and 800 Pa, respectively) and a horizontal axis which is a gap [mm] between the electrodes (the columns correspond to 9.5, 11, 12, 13, 14, 15, and 16 mm, respectively) when 10 W, 15 w, 20 W, and 25 W of RF power were applied to the respective matrixes. The results are shown in FIG. 3. Each cell in each matrix shows the number of ignition failures per 50 attempts using a gray scale from the lightest representing no ignition failure to the darkest representing 50 occurrences of ignition failure. As shown in FIG. 3, there is no significant difference in ignitability between oxygen and carbon dioxide, indicating that carbon dioxide can ignite a plasma in a manner similar to that of igniting a plasma using oxygen.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming an oxide film by plasma-assisted processing, comprising:
   (i) supplying a precursor reactive to none of oxygen, $C_xO_y$, and $N_xO_y$ (x and y are integers) without a plasma to a reaction space wherein a substrate is placed;
   (ii) exposing the precursor and the substrate to a plasma of $C_xO_y$ generated in the reaction space, devoid of a remote plasma; and
   (iii) forming an oxide film on the substrate using the precursor and the plasma,
   wherein the plasma-assisted processing is plasma-enhanced atomic layer deposition (PEALD), wherein step (i) comprises (ia) supplying the precursor in the reaction space to adsorb the precursor on the substrate, followed by purging to remove a non-adsorbed precursor from the substrate, step (ii) comprises (iia) exposing the adsorbed precursor to the plasma to cause surface reaction to the adsorbed precursor, followed by purging to remove a non-reacted component from the substrate, and steps (ia) and (iia) constitute one cycle and are repeated to form the oxide film in step (iii),
   wherein the purging in step (ia) is stopped before removing most of the non-adsorbed precursor to the extent that the non-adsorbed, non-removed precursor reacts with the plasma in a gas phase.

2. The method according to claim 1, wherein the precursor contains Si, Ti, or Ge, and the oxide film is constituted substantially by SiO, TiO, or GeO.

3. The method according to claim 2, wherein the precursor is an organoaminosilane.

4. The method according to claim 1, wherein the plasma is generated in the reaction space by applying RF power to the reaction space.

5. The method according to claim 1,
   wherein $C_xO_y$ and/or $N_xO_y$ are/is supplied continuously to the reaction space throughout steps (i) to (iii).

6. The method according to claim 1, wherein in step (ii), an oxygen plasma is further added to the reaction space.

7. The method according to claim 1, wherein in step (ii), no oxygen plasma is used in the reaction space.

* * * * *